United States Patent
Goodnow et al.

(10) Patent No.: US 8,174,329 B2
(45) Date of Patent: May 8, 2012

(54) POWER MANAGEMENT ARCHITECTURE AND METHOD OF MODULATING OSCILLATOR FREQUENCY BASED ON VOLTAGE SUPPLY

(75) Inventors: Kenneth J. Goodnow, Essex Junction, VT (US); Clarence R. Ogilvie, Huntington, VT (US); Christopher B. Reynolds, Milton, VT (US); Sebastian T. Ventrone, South Burlington, VT (US); Keith R. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/787,167

(22) Filed: May 25, 2010

(65) Prior Publication Data
US 2010/0231306 A1    Sep. 16, 2010

Related U.S. Application Data

(63) Continuation of application No. 11/876,076, filed on Oct. 22, 2007, which is a continuation-in-part of application No. 11/531,050, filed on Sep. 12, 2006, now abandoned.

(51) Int. Cl.
*H03K 3/03* (2006.01)
*H03L 5/02* (2006.01)
(52) U.S. Cl. ............ 331/57; 331/1 A; 331/18; 331/185
(58) Field of Classification Search .................. 331/1 A, 331/18, 57, 185, 186
See application file for complete search history.

(56) References Cited

U.S. PATENT DOCUMENTS

| | | | |
|---|---|---|---|
| 5,227,675 A | 7/1993 | Taguchi | |
| 5,315,271 A | 5/1994 | Pascual et al. | |
| 5,329,254 A | 7/1994 | Takano | |
| 5,461,591 A | 10/1995 | Kim et al. | |
| 5,490,182 A | 2/1996 | Arai | |
| 5,847,617 A * | 12/1998 | Reddy et al. | 331/57 |
| 5,857,109 A * | 1/1999 | Taylor | 712/37 |
| 5,899,336 A | 5/1999 | Kataoka | |
| 6,104,253 A | 8/2000 | Hall et al. | |
| 6,252,465 B1 | 6/2001 | Katoh | |
| 6,445,253 B1 | 9/2002 | Talbot | |
| 6,737,926 B2 | 5/2004 | Forbes | |
| 6,781,431 B2 | 8/2004 | Taito et al. | |
| 6,819,195 B1 * | 11/2004 | Blanchard et al. | 331/173 |
| 6,933,869 B1 | 8/2005 | Starr et al. | |
| 6,995,621 B1 | 2/2006 | Culler | |
| 7,315,213 B2 | 1/2008 | Yamanaka et al. | |
| 7,355,486 B2 * | 4/2008 | Kelkar et al. | 331/16 |
| 2007/0250800 A1 | 10/2007 | Keswick | |
| 2008/0068100 A1 | 3/2008 | Goodnow et al. | |

* cited by examiner

*Primary Examiner* — Levi Gannon
(74) *Attorney, Agent, or Firm* — David Cain; Roberts Mlotkowski Safran & Cole, P.C.

(57) ABSTRACT

A method and system for modulating logic clock oscillator frequency based on voltage supply. The system comprises a logic unit having a logic operation and a device to produce self-adjusting clocks to match the logic operation. The device is configured to use supply voltage as an independent variable to optimize device parameters for voltage variations. The invention is also directed to a design structure on which a circuit resides.

23 Claims, 14 Drawing Sheets

POWER MANAGEMENT ARCHITECTURE AND METHOD OF MODULATING OSCILLATOR FREQUENCY BASED ON VOLTAGE SUPPLY

CROSS-REFERENCE TO RELATED APPLICATIONS

The present application is a continuation of U.S. application Ser. No. 11/876,076, filed on Oct. 22, 2007, which is a continuation in part of U.S. application Ser. No. 11/531,050, filed on Sep. 12, 2006, the disclosures of which are expressly incorporated by reference herein in their entirety.

FIELD OF THE INVENTION

The invention relates to a method and system for modulating frequency based on voltage supply, and more particularly, to a power management architecture and method of modulating oscillator frequency based on voltage supply. The invention is also directed to a design structure on which a circuit resides.

BACKGROUND

For operation in low or ultra-low power environments it is important to be able to operate from a variable power supply. Examples of low power environments include radio frequency ID (RFID) applications, as well as devices which measure vibrations in a structure. In such devices, it is not uncommon to collect limited and intermittent amounts of energy from an outside source such as, for example, light, vibrations, etc. In an attempt to keep form factor and cost low the devices do not have a typical power supply, e.g., AC adapter, batteries, large capacitors or other supply storage devices. Due to this lack of any typical power supply in these devices, the available power is intermittent as is the supply voltage, and as such, the logic clock frequency must be changed to meet timing.

Control of the load (logic) to efficiently use the voltage supply variation is complex and the process and circuitry used in this complex control consumes energy. To control the voltage and frequency independently requires a processor (or state machine) sequencing that insures all frequency settings can be supported by corresponding voltages. In addition, using this type of control in an environment with inexact tolerances will make inefficient use of available power.

More specifically, in known systems, it is necessary to build a frequency look-up table which includes a listing of frequencies that support respective voltages. However, it is not a trivial task to build such a look-up table since the relationship between voltage and frequency is not a straightforward function; that is, frequency and voltage do not have a linear relationship. To build a look-up table it is thus necessary to perform a complex timing analysis for each circuit at different voltages to determine respective frequencies. This timing analysis can then be used to create frequency look-up tables.

Also, a state machine or processor may be used to determine the required voltage/frequency relationship. However, the use of a state machine or process is very costly in power consumption. This, of course, will decrease the overall performance of the device. Also, the use of a state machine is very complex since it requires a lot of circuitry.

By way of a more specific example, in current systems, in order to minimize power for a given performance power consumption currently two controls are necessary, voltage and clock frequency. This control could be internal or external. Voltage and clock frequency must be controlled carefully to insure that the clock frequency can be supported by any given voltage. The internal or external controls provide control to a DAC and a divider, as shown in FIG. 1. In this example, the logic chip is driven by a programmable power supply. When low power operation is desired (trading off maximum performance) the clock frequency can be reduced (via the oscillator/divider) which, in turn, allows the power supply to be reduced. In such a system, the supply voltage cannot be reduced without first reducing the clock frequency. If the supply voltage is reduced without first reducing the clock frequency, timings will not be met. In such known systems, the oscillator frequency does not track the power supply; instead, control over the power supply and/or oscillator/divider is by the controlled logic and an external logic controller.

SUMMARY

In a first aspect of the invention, a system for modulating oscillator frequency based on voltage supply includes a logic unit having a logic operation frequency and a device to produce self-adjusting clocks to match the logic operation frequency. The device is configured to use supply voltage as an independent variable to optimize device parameters for different voltage variations in the supply voltage.

In another aspect of the invention, a system comprises a logic unit having a logic operation frequency and module which optimizes frequency to substantially match the logic operation of the logic unit using only a supply voltage as the control variable.

In yet another aspect of the invention, a method for determining a slowest path in a circuit comprises finding a path with worst case slack for Vmin to Vmax and extracting and saving path data of the path with the worst case slack. When a last process corner is found and $V_{DD}$=Vmax, the process creates and places a feedback reference path into the circuit.

In yet another aspect of the invention, a design structure is embodied in a machine readable medium for designing, manufacturing, or testing a design. The design structure comprises: a logic unit having a logic operation frequency; and a device to produce self-adjusting clocks to match the logic operation frequency, the device being configured to use supply voltage as an independent variable to optimize device parameters for different voltage variations in the supply voltage.

In embodiments, the design structure comprises a netlist, which describes the circuit. The design structure resides on storage medium as a data format used for the exchange of layout data of integrated circuits. The design structure includes at least one of test data files, characterization data, verification data, or design specifications. The design structure further comprises one or more components for: finding a path with worst case slack for Vmin to Vmax; extracting and saving path data of the path with the worst case slack; and creating and placing a feedback reference path into the circuit when a last process corner is found and $V_{DD}$=Vmax.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to a method and system for modulating frequency based on voltage supply, and more particularly, to a power management architecture and method of modulating oscillator frequency based on voltage supply. The system and method of the invention reduces the complexity and additional control circuitry that consumes energy. The system and method of the invention also removes many of the inexact tolerances from the control that erode efficient use of power.

In embodiments, the system and method of the invention is configured to modulate the frequency of the oscillator based on the supply voltage in a way that mimics the device operation. By way of example, the transfer function of the oscillator (frequency/power supply) may be open loop (programmed into the oscillator circuit) or closed loop with reference circuits/paths to track device parameters.

In embodiments, there are several options to accomplish the functionality of the invention with various levels of complexity in design, timing analysis, and timing optimization as discussed in more detail below. For example, the invention includes:

(i) In an open loop system, the supply voltage is monitored and the corresponding frequency is selected (Algorithmic/table-driven);

(ii) A ring oscillator (RO) driving the system clocks, where the RO is running off the same supply as the logic;

(iii) As a refinement of (ii), a "slow path" is duplicated in the RO;

(iv) As a refinement of (iii), a plurality of "slow" paths are switched into the RO based on supply voltage;

(v) As a refinement of (iv), the slowest path is automatically selected;

(vi) As a refinement of (v), the slowest paths are selected based on clock phase or transition direction; and/or (vii) As a refinement of (v) or (vi), the sampled logic may be moved near the circuits to be monitored or drive oscillators on different power islands while tracking the operation of the critical path.

Figure 1:
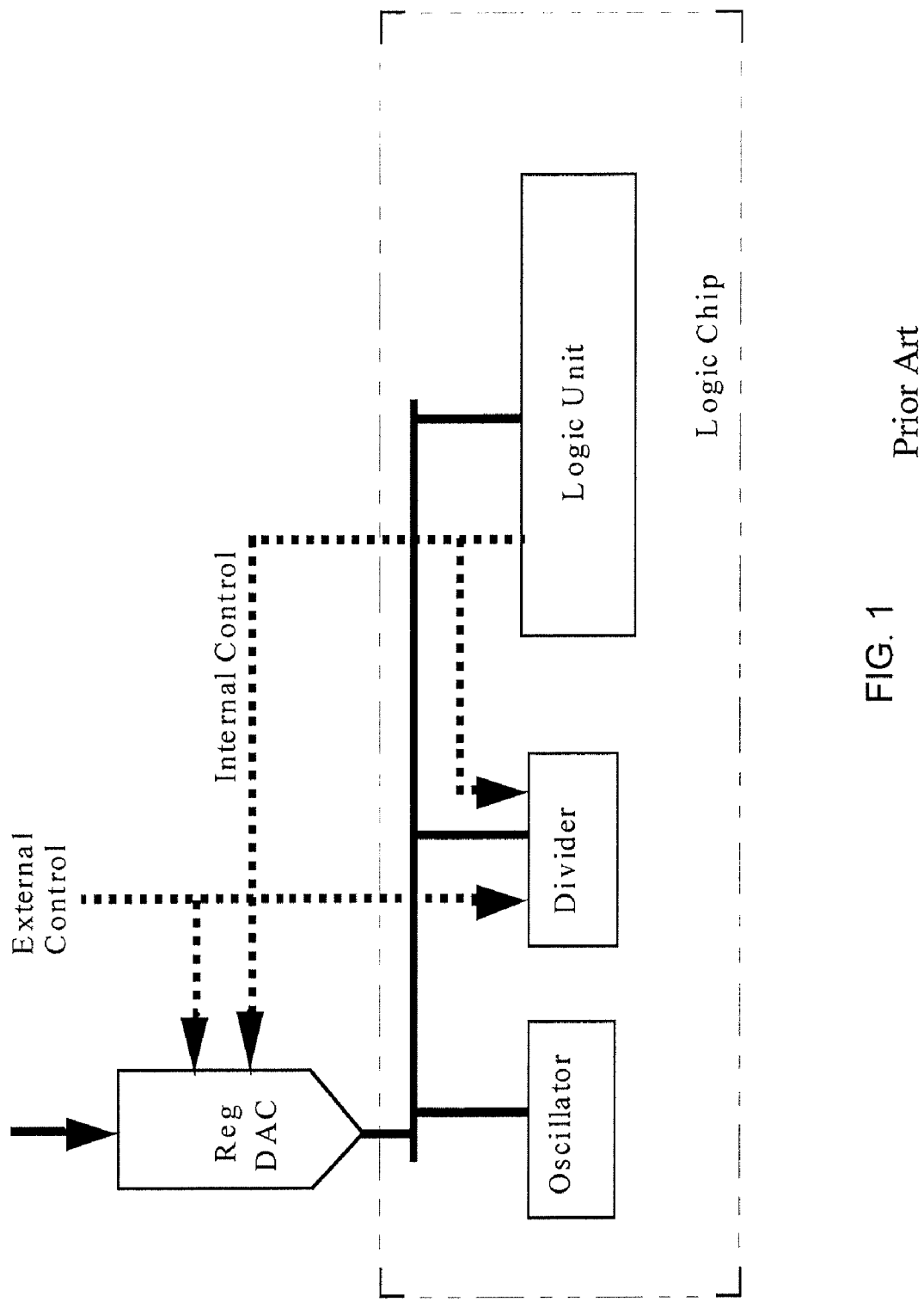
FIG. 1 is representative of a conventional system requiring two points of control.
Figure 2:
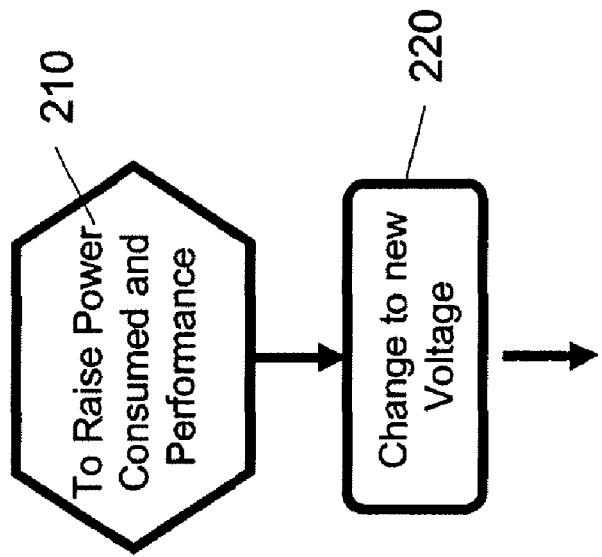
FIG. 2 shows an exemplary control flow diagram according to an embodiment of the invention.
Figure 2:
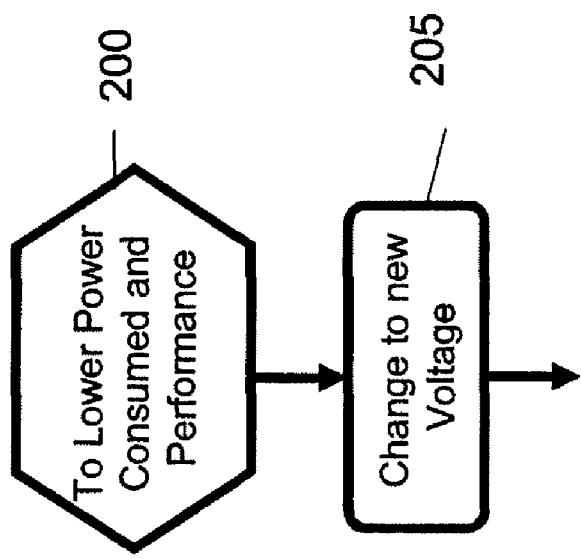

FIG. 2 shows an illustrative general flow diagram, implementing the embodiments of the invention. FIG. 2 (and other flow diagrams described herein) may equally represent a high-level block diagram of the invention. The steps of FIG. 2 (and other flow diagrams described herein) may be implemented and executed from either a server, in a client server relationship, or they may run on a user workstation with operative information conveyed to the user workstation. Additionally, the invention can take the form of an entirely hardware embodiment, an entirely software embodiment or an embodiment containing both hardware and software elements.

In an embodiment, the invention is implemented in software, which includes but is not limited to firmware, resident software, microcode, etc. Furthermore, the invention can take the form of a computer program product accessible from a computer-usable or computer-readable medium providing program code for use by or in connection with a computer or any instruction execution system. For the purposes of this description, a computer-usable or computer readable medium can be any system that can contain, store, communicate, propagate, or transport the program for use by or in connection with the instruction execution system, system, or device. The medium can be an electronic, magnetic, optical, electromagnetic, infrared, or semiconductor system (or system or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

Referring back to FIG. 2, at step 200, a decision is made to lower the power consumed by the device. At step 205, the voltage is changed in accordance with the invention. Similarly, at step 210, a decision is made to raise the power consumed by the device. At step 220, the voltage is changed in accordance with the invention. As shown, the voltage may be changed without concern for frequency look-up since frequency is changed automatically in accordance with the invention and, as such, there is no requirement for complex circuitry or other drawbacks noted in conventional systems.

Figure 3:
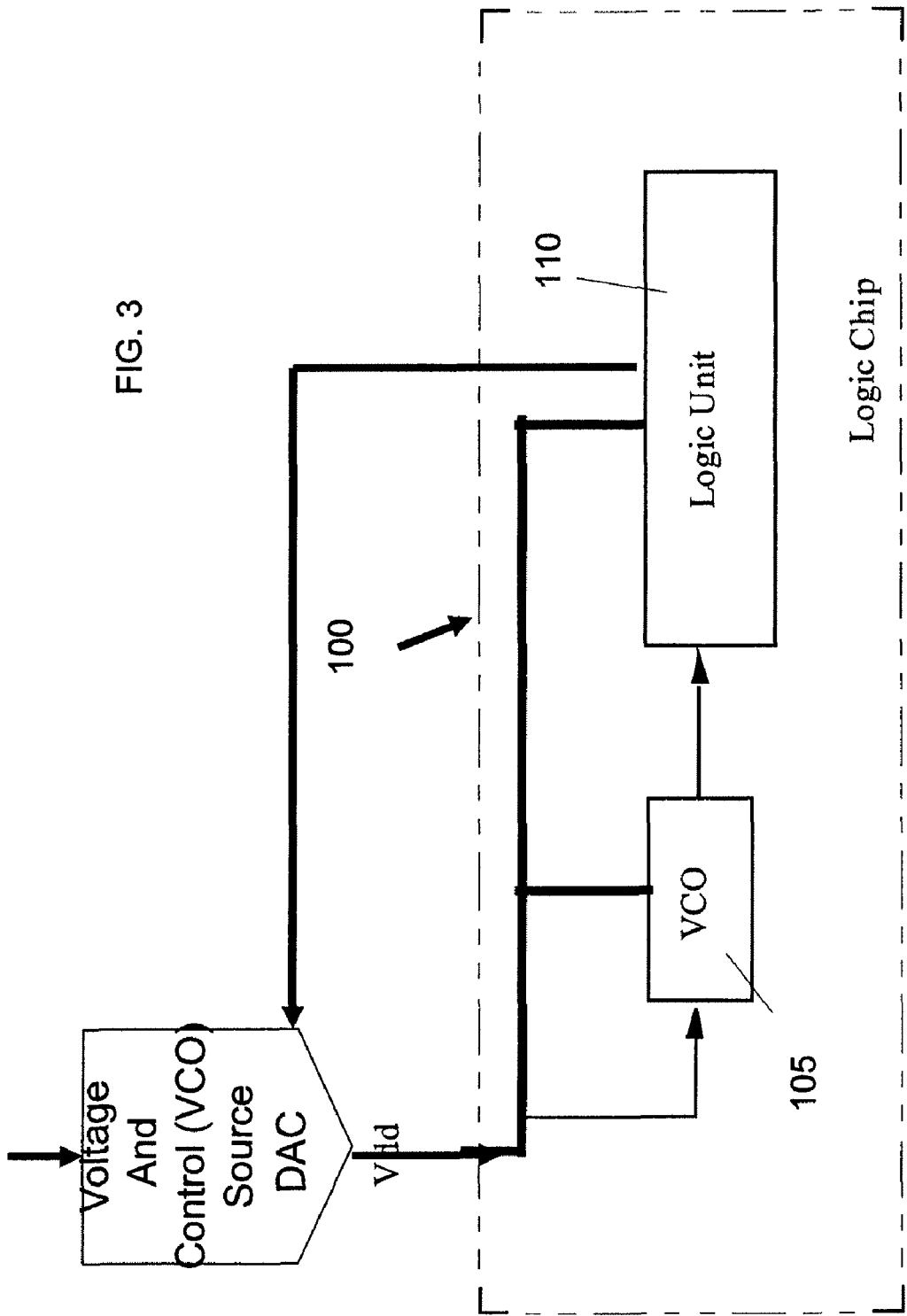
FIG. 3 shows an exemplary circuit layout according to an embodiment of the invention.

FIG. 3 shows an exemplary circuit layout which may be used for implementing aspects of the invention. The circuit layout 100 of FIG. 3 is provided as an illustrative example. Accordingly, it should be understood by those of ordinary skill in the art that other circuit layouts can also be used to implement the invention. In the exemplary circuit layout 100, clock frequency is directly controlled by available power (voltage). In this implementation, the invention includes a voltage and control oscillator (VCO) 105 driving the system clock (logic unit) 110, where the VCO transfer function would be matched to the logic operation of the logic unit 110. In embodiments, the transfer function is designed into the VCO circuitry. Alternatively, the voltage can be measured and a table used to select the appropriate frequency, directly from the VCO 105.

More specifically, in embodiments shown in FIG. 3, the circuitry 100 simplifies the control and minimizes the power for a given performance. In this manner, the design of the control for the VCO frequency for the system is provided through Vdd using the inherent supply voltage/frequency relationship of the VCO 105. This embodiment also takes advantage of the performance (delay and frequency) coupling between the on chip VCO 105 and the logic unit 110. The coupling of delay and frequency between the VCO 105 and logic unit 110 is designed into the circuit for optimal power performance, as can be implemented by one of ordinary skill in the art after reading and understanding the present disclosure. Thus, using the system of the invention, the frequency can be adjusted based on the Vdd, e.g., a decrease in the Vdd will result in a decrease in the frequency and an increase in the Vdd will result in an increase in the frequency.

Figure 4:
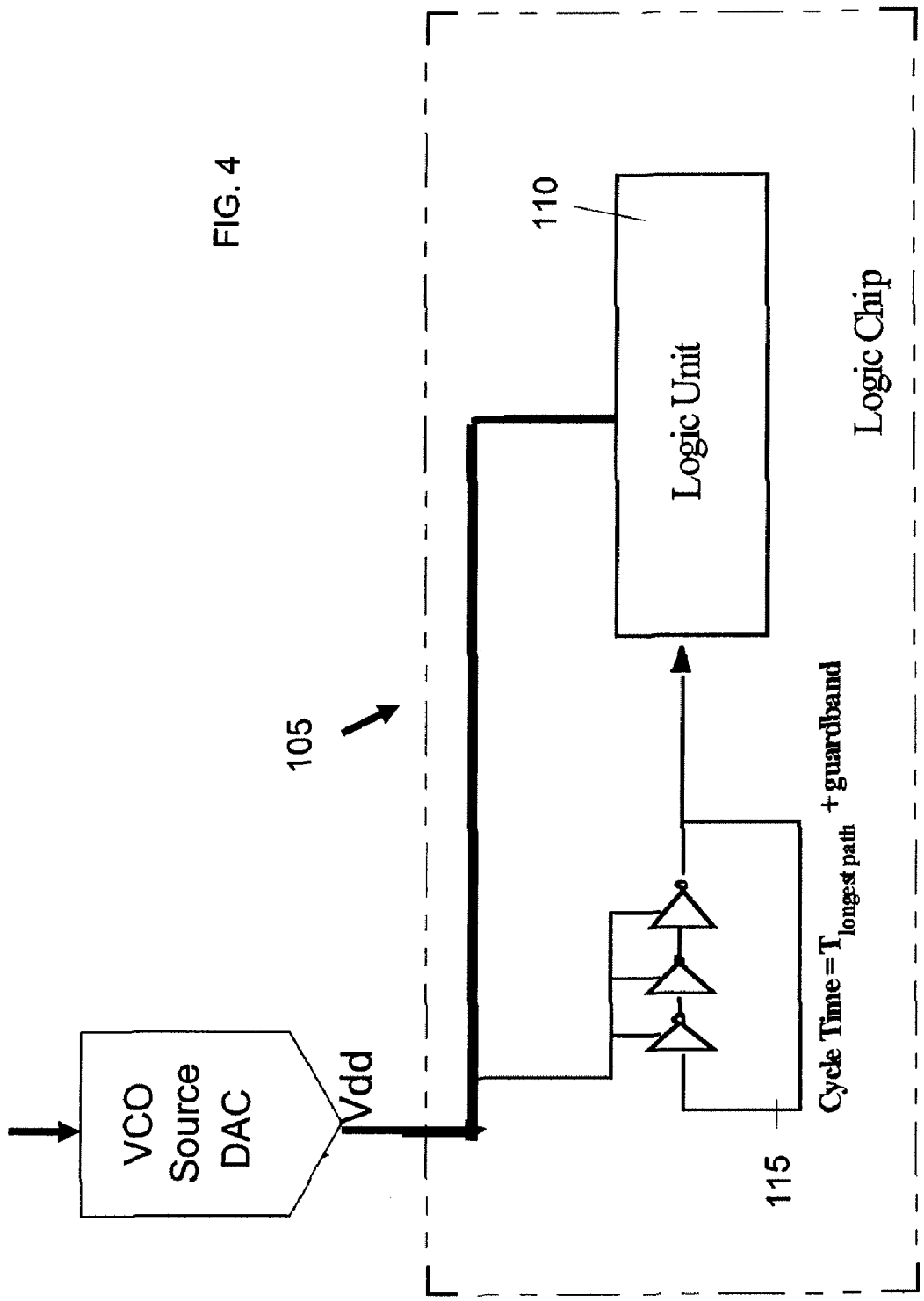
FIG. 4 shows an exemplary circuit layout according to an embodiment of the invention.

FIG. 4 shows another exemplary circuit layout in accordance with the invention. In this implementation, a Ring Oscillator (RO) 115 is used to implement the invention. In this implementation, the RO 115 may include a series of inverters which will match the oscillator frequency to the speed of the logic unit 110 for a given voltage. That is, in implementation, the RO 115 will ring at the same or substantially the same frequency as the logic unit 110, using only the supply voltage as the variable.

In the embodiment of FIG. 4,

Cycle Time=$T_{longest\ path}$+guardband.

In implementation, the cycle time is the latch to latch delay, the $T_{longest\ path}$ is the longest logic path, which will act as a limiting factor, and the guardband is the delay in the wirings. The longest logic path will set a limit on the RO 115 to never run faster than the circuit, itself. It should be understood by those of skill in the art that the logic should be as fast as possible for a given voltage, but should not be faster than the given frequency for a given voltage. In an embodiment, the longest path is created by copying design data from the logic unit 110, and inserting it into the RO 115.

Figure 5:
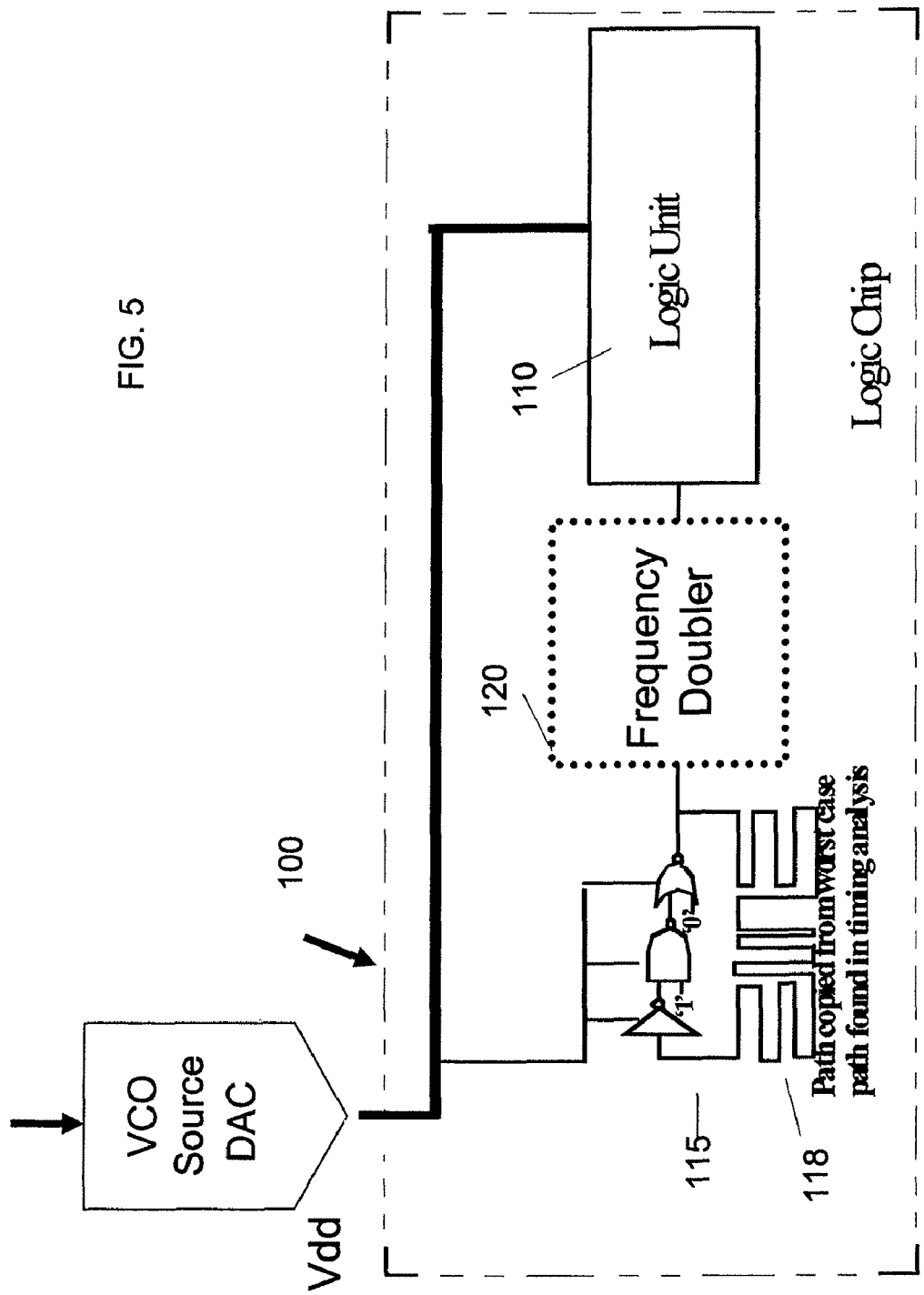
FIG. 5 shows an exemplary circuit layout according to an embodiment of the invention.

FIG. 5 shows another exemplary circuit layout in accordance with the invention. In this implementation, the RO 115 has a "slow path" feedback designated generally as reference numeral 118. In more particularity, in a variation of the RO of FIG. 4, this embodiment uses the longest path found in the timing analysis to create a duplicate path 118 that will track the actual circuit. In the embodiment shown in FIG. 5, the path 118 is copied from the worst case path found in the timing analysis. In this manner, by adding a feedback path (e.g., wiring) 118 to the RO 115, it is possible to add an additional delay into the circuit.

The feedback path 118 (or RO 115) may include control structures designed to be sensitive to critical process parameters like channel length (or overlap capacitances, or other parameters that are critical to particular applications) to further tune the RO 115. Circuits used in the feedback path 118 may also be selected to track variations in specific process parameters (or performance shifts over time).

In an embodiment, the feedback path 118 (or RO 115) can be trimmed or adjusted (i.e., by adding/deleting stages). This can be done digitally, with fuses, or physically in the design. This trimming/adjustment can be performed to accentuate specific sensitivities, if the desire is to have the RO 115 track particular process parameters. Also, it is contemplated that a variety of trimming options can be switched in/out, each making the RO 115 sensitive to a specific process parameter. Such examples include extremely short or long channel devices, gate vs. overlap caps, low vs. high Vt devices, etc. It is possible to place the reference (e.g., RO and feedback path) close to the logic path to minimize cross-chip differences. Moreover, as shown with reference to FIG. 5, the RO 115 may include a single inverter (resulting in an odd number of invertors), with a "NAND" gate and a "NOR" gate, in series. This is one of many different options to tune the RO 115.

Figure 6:
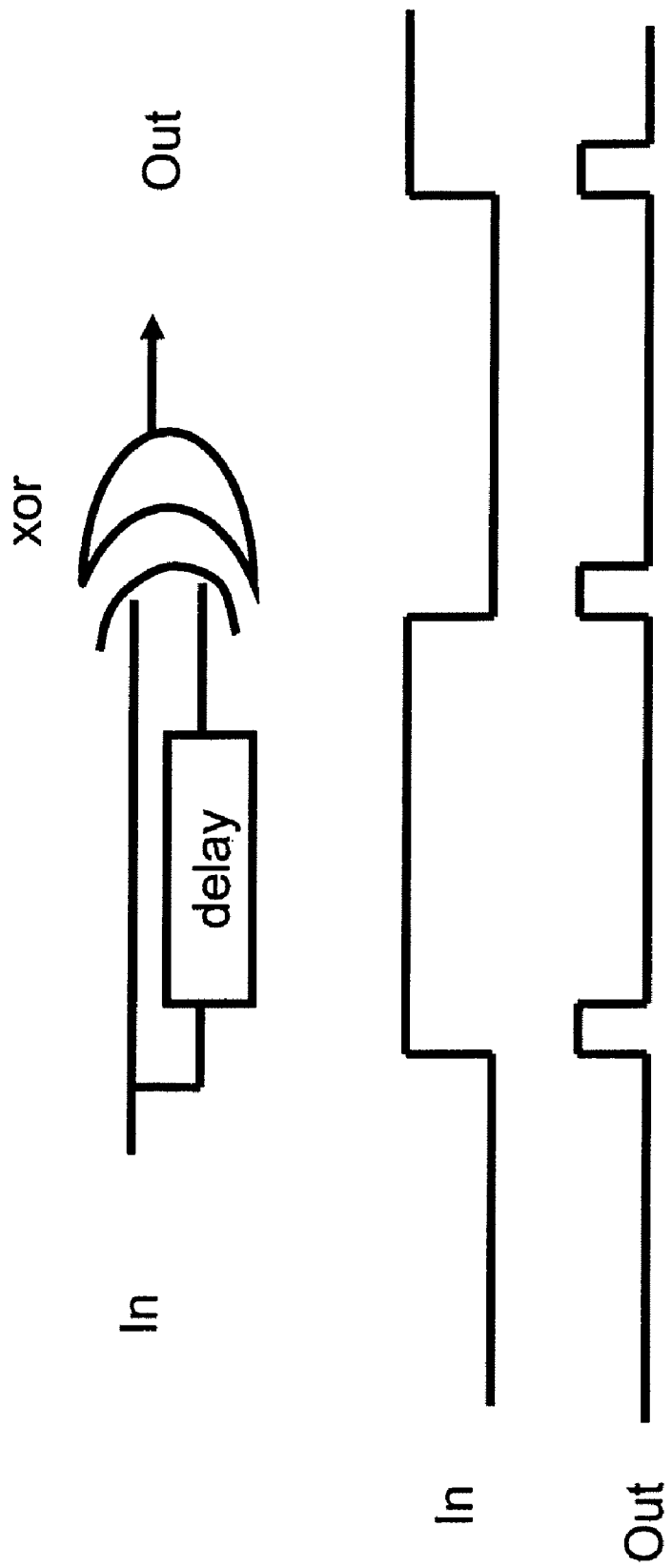
FIG. 6 shows an exemplary timing using a frequency doubler in accordance to an embodiment of the invention.

In an optional embodiment, a frequency doubler 120 may be inserted between the RO 115 and the logic unit 110. In this embodiment, the RO 115 may have been sensitized to ring at two times the required frequency. But, by using the frequency doubler 120, the frequency will be corrected to run at an appropriate frequency for the designed logic unit. As thus should be understood, in this optional implementation, the frequency doubler 120 will provide a pulse at each transition, as shown graphically in FIG. 6.

Figure 7:
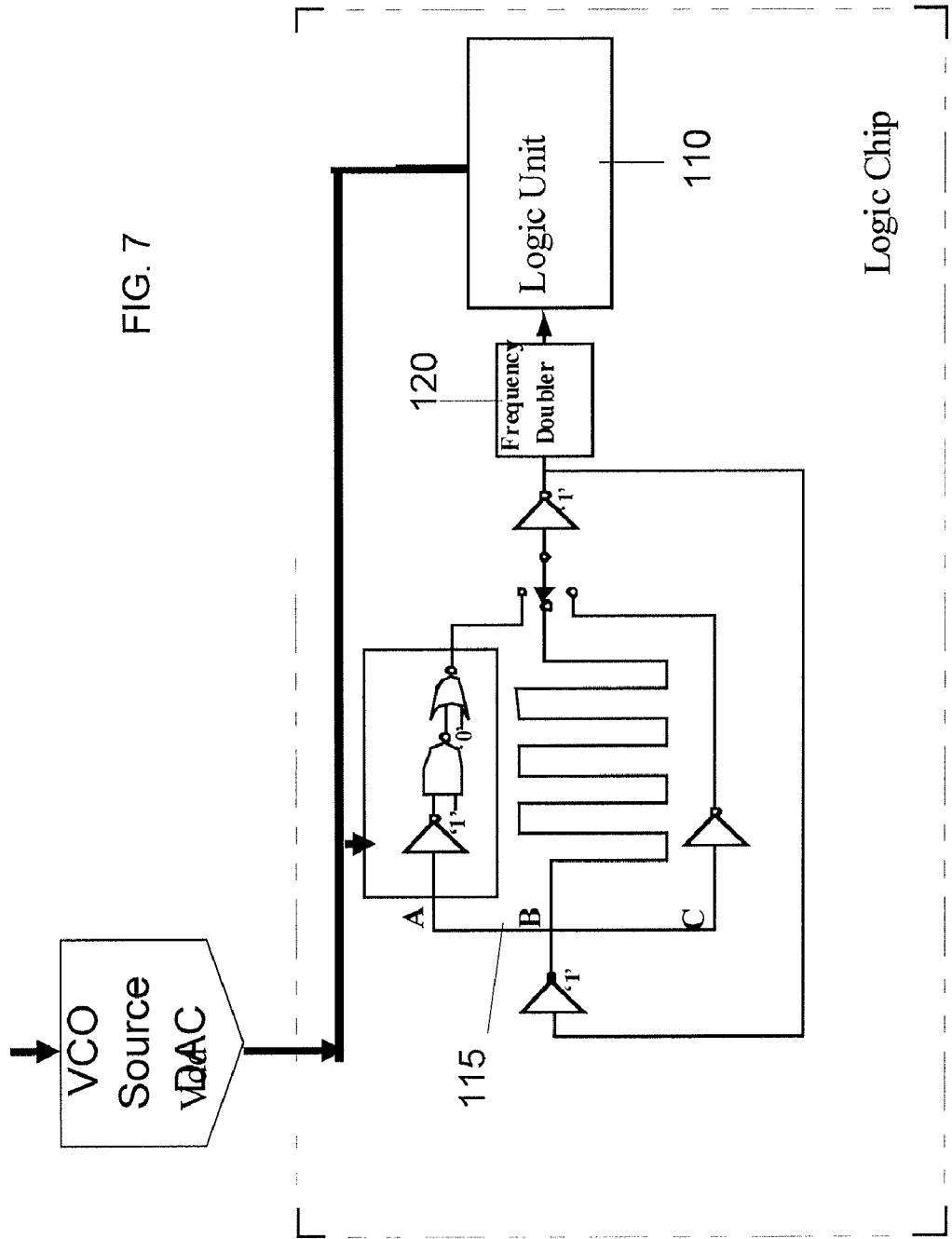
FIG. 7 shows an exemplary circuit layout according to an embodiment of the invention.

FIG. 7 shows another exemplary circuit layout in accordance with the invention. In the embodiment of FIG. 7, the RO 115 has a switchable "slow path" feedback. In the embodiment of FIG. 7, in the case where the slowest path may not be unique, several paths may be selected for monitoring, where the slowest path for the current conditions is switched into the ring oscillator's feedback loop. In this case, timing analysis can be used at the various voltages to determine the slowest path and switch in its "dual" reference path.

In the embodiment of FIG. 7, three paths, A, B and C, represent different mixes of logic and path lengths which may show up in a timing analysis. In this example, path "A" represents a long path that is dominated by logic delay, path "B" represents a path that is dominated by wire length, while path "C" represents a path that is a mixture of the path "A" and path "B". The paths "A", "B" and "C" can be selected from the worst case timing corners over a supply voltage. In such a scenario, the supply voltage is sampled/digitized and the correct feedback path selected based on the power supply voltage. In this example, the worst case path will automatically be selected since the circuit is configured to wait for all paths to accumulate prior to switching. In optional embodiments, the frequency doubler 120 may be inserted between the RO 115 and the logic unit 110.

Figure 8:
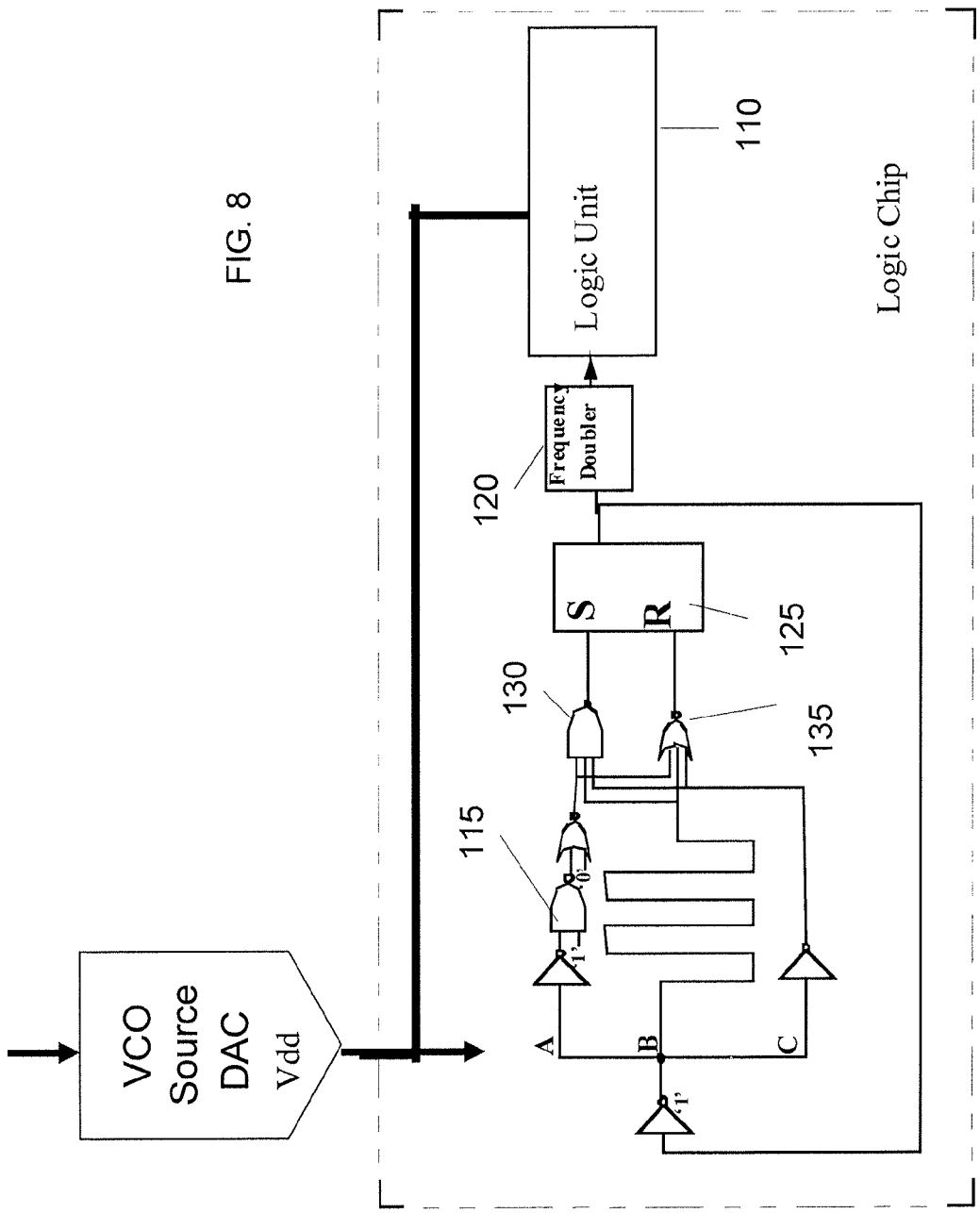
FIG. 8 shows an exemplary circuit layout according to an embodiment of the invention.

FIG. 8 shows another exemplary circuit layout in accordance with the invention. In the embodiment of FIG. 8, switching of the "critical" paths can be eliminated by using logic to detect the slowest path. In this example, a set/reset latch 125 is provided in the path between the RO 115 and the logic unit 110. In optional embodiments, the frequency doubler 120 may be inserted between the set/reset latch 125 and the logic unit 110.

At the input of the set (S) is an "AND" gate 130 and at the input of the reset (R) is a "NOR" gate 135. Thus, the output of the "AND" gate 130 will provide a signal to the set (S) and at the output of the "OR" gate 135 will provide a signal to the reset (R). Three paths, A, B, C, are selected as being critical with some combination of parameters. In this embodiment, the rising edges of the critical paths are provided to the "AND" gate 130 such that the slowest path controls the output of the "AND" gate 130 to the set/reset latch 125. When the last path makes the low to high transition the output of the set/reset latch 125 goes high. Likewise, on the negative transitions, all paths must be "0" to satisfy the "NOR" (negative "OR") for the set/reset latch 125 to go low. Accordingly, the output of the "NOR" gate 135 is a "1" and the reset function of the set/reset latch 125 resets the signal to "0". On the other hand, the output of the "AND" gate 130 is a "0" and the set function of the set/reset latch 125 outputs the "0". Thus, as should be understood, the AND/OR gates provide the information on the slowest transition and the set/reset latch 125 can discriminate between the rising edge and falling edge.

Figure 9:
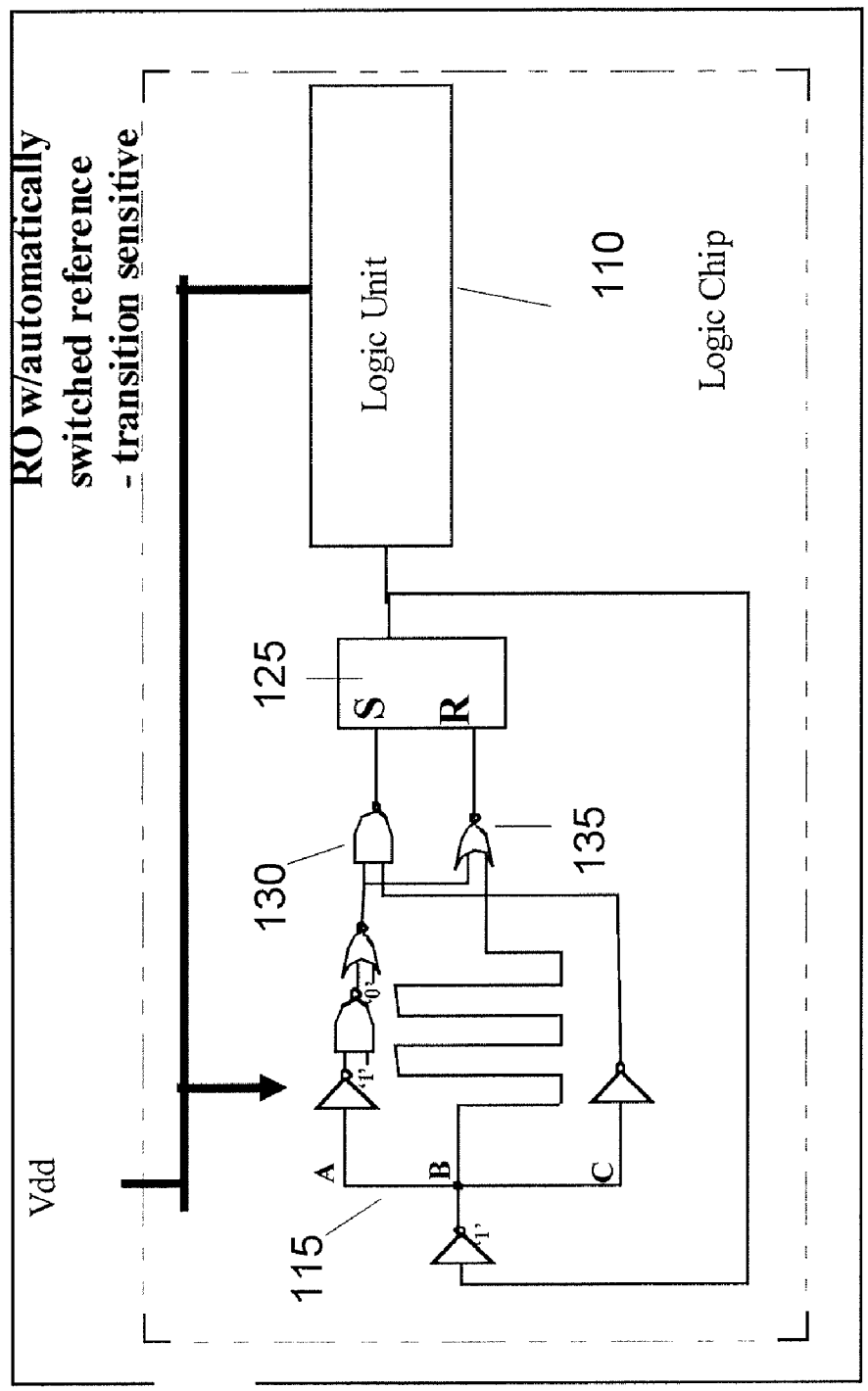
FIG. 9 shows an exemplary circuit layout according to an embodiment of the invention.

FIG. 9 shows another exemplary circuit layout in accordance with the invention. In the embodiment of FIG. 9, the RO with slowest path feedback based on transition direction may be selected as described above. For example, optionally, paths may be selected based on clock phase or transition sensitivities. Some paths may be found to have "negative slack" only on a low phase of the clock (or "0">"1" data transition) or the high phase of the clock (or a "1">"0" transition). In this scenario, only the edge of concern needs to be sampled as the "worst case" timing.

In the example of FIG. 9, path "A" is found to have "worst case slack" on both clock low (rising edge) and clock high (falling edge), so it is included in the reference path on both the "1" and "0" feedback path. Path "B" is found to only cause negative slack on clock high, so it is not included in the clock low "worst case" timing reference. Path "C" is only found to have a worst case slack with clock low and is only included in the rising edge test.

Still referring to FIG. 9, the set/reset latch 125 is provided in the path between the RO 115 and the logic unit 110. At the input of the set (S) function is an "AND" gate 130 and at the input of the reset (R) function is a "NOR" gate 135. In this example, the input paths at the "AND" gate 130 reach "1"; whereas, the input paths at the "NOR" gate reach "0". In this manner, and as discussed above, the circuit can wait for the "worst" path before it allows the last edge of the timing to propagate through the set/reset latch 125. Accordingly, the slowest path can be selected automatically and dynamically thus ensuring that the RO 115 has an oscillation that is always ringing at the longest path regardless of voltage, after sampling any number of paths.

Figure 10:
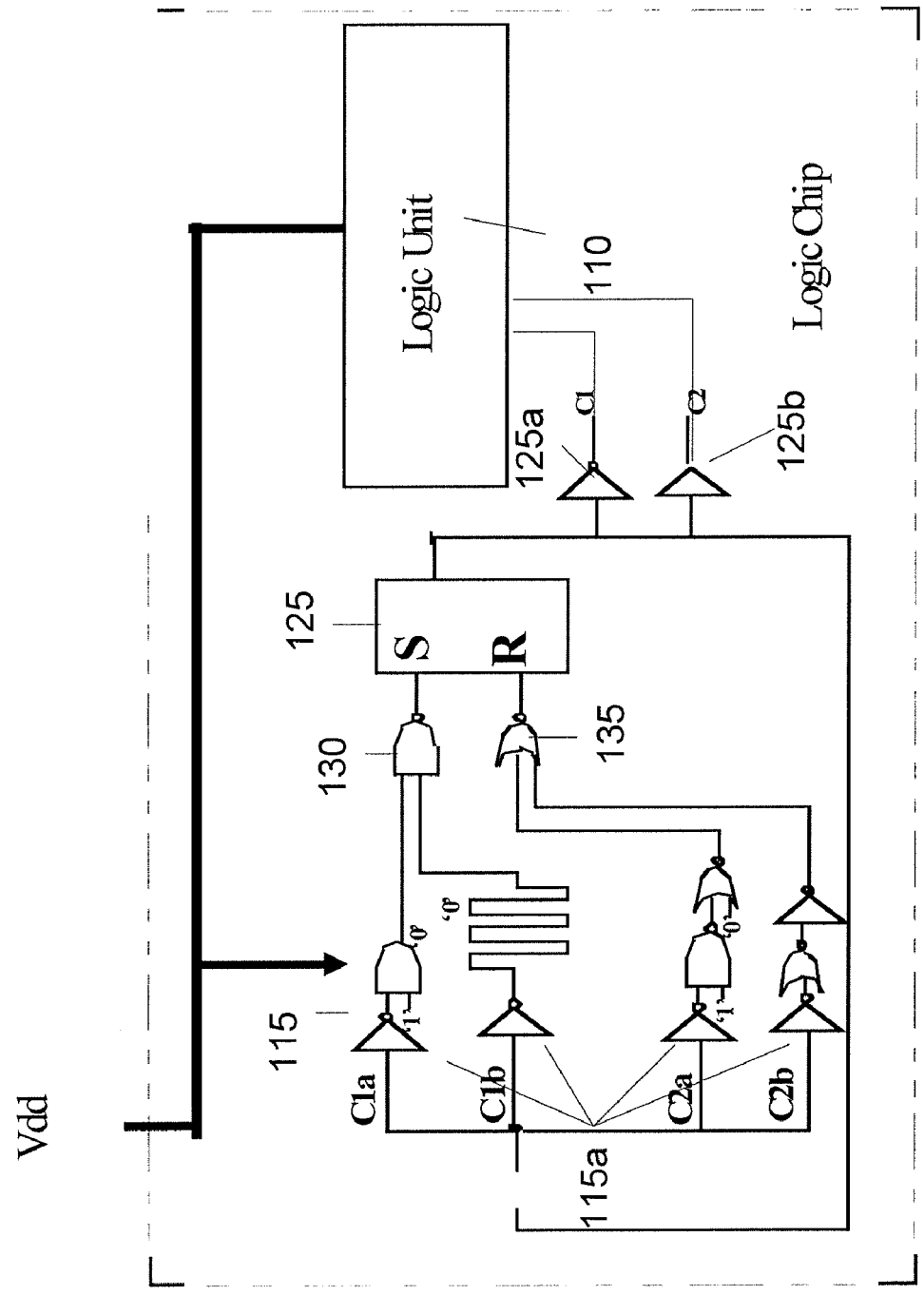
FIG. 10 shows an exemplary circuit layout according to an embodiment of the invention.

FIG. 10 shows another exemplary circuit layout in accordance with the invention. In more particularity, referring to FIG. 10, paths $C_{1a}$ and $C_{1b}$ drive the "AND" gate 130 and paths $C_{2a}$ and $C_{2b}$ drive the "NOR" gate 135. In this manner, paths $C_{1a}$ and $C_{1b}$ are fed to the set input of the set/reset latch 125; whereas, paths $C_{2a}$ and $C_{2b}$ are fed to the reset input of the set/reset latch 125. In embodiments, the inverters 115a in paths $C_{1a}$, $C_{1b}$, $C_{2a}$ and $C_{2b}$ are provided to correct polarity. Due to the placement and number of invertors (e.g., odd number of invertors), input paths at the "AND" gate 130 reach "1" and the input paths at the "NOR" gate 135 reach "0". Accordingly, the output of the "NOR" gate 135 is a "1" and the reset of the set/reset latch 125 resets the signal to "0". Thus, as should be understood by those of skill in the art, the reset can convert the "0" to a "1", on its output. On the other hand, the output of the "AND" gate 130 is a "0" and the set of the set/reset latch 125 outputs the "0".

Figure 11:
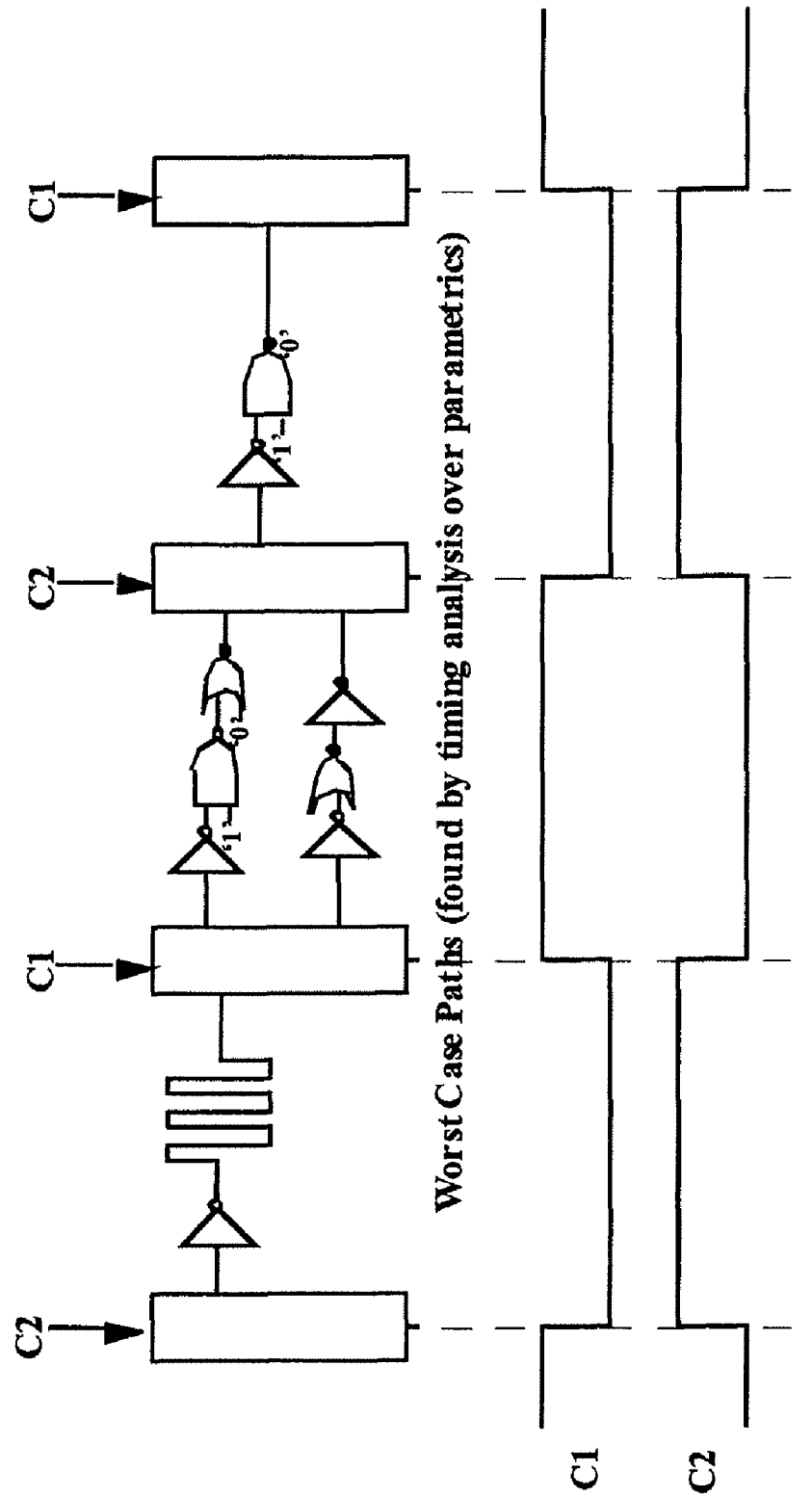
FIG. 11 shows out of phase alignment between clocks in a pipeline clocking.

As should be understood, in a conventional single level latch (transparent latch) pipeline, as shown in FIG. 11, there is an inherent problem in getting the appropriate clock duty cycle and frequency, i.e., the clock C2 is the inverse of clock C1 however the duty cycle of these clocks for optimal frequency for a given power needs to be related to the delay of the logic circuits preceding the corresponding clocked latch (C1-1Latch or C2-Latch). To compensate for this inherent problem in pipeline clocking, in the embodiment of FIG. 10, the output of the set/reset latch 125 will feed to either an inverter 125a through C1 or a buffer 125b through C2. The inverter 125a will phase shift the signal 180 degrees in order to provide a clock speed with the appropriate phase relationship between C1 and C2. This structure allows the clock duty cycle as well as the frequency to match the individual circuits in each phase of the pipeline.

Figure 12:
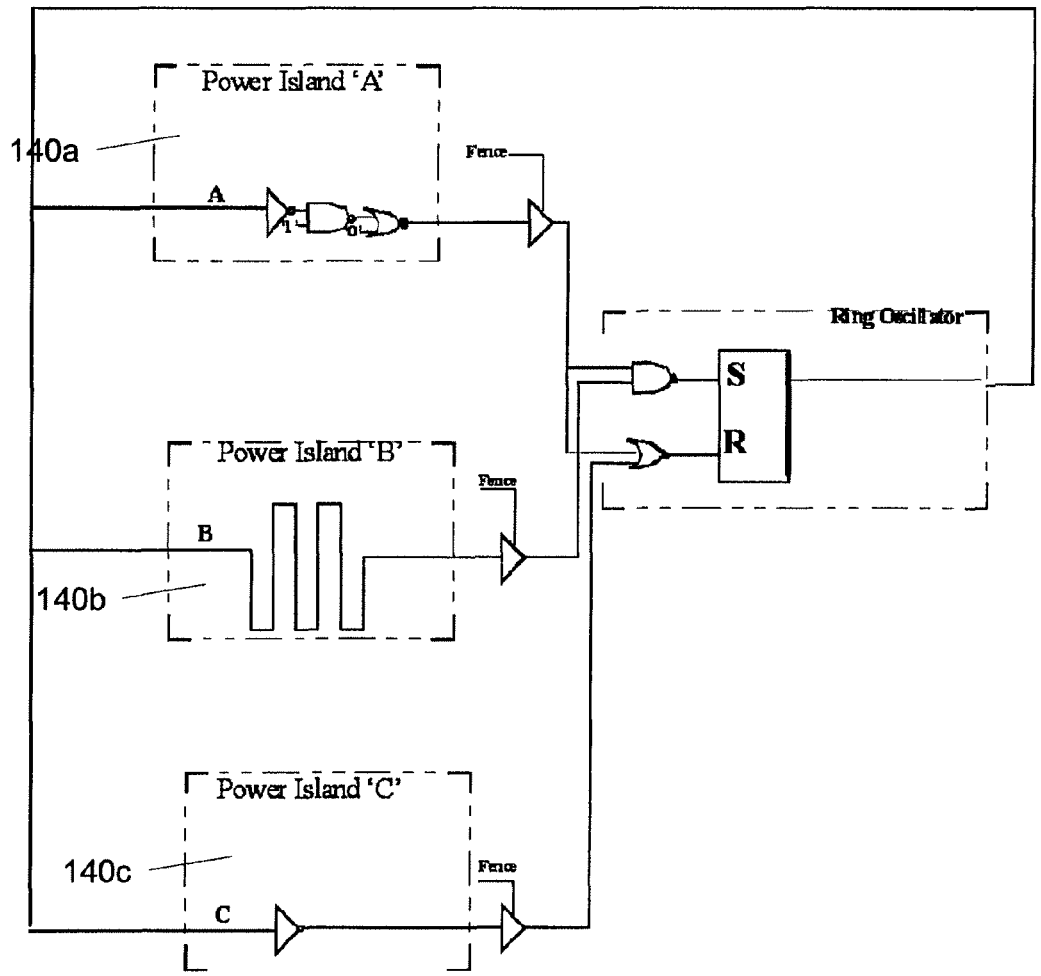
FIG. 12 shows an exemplary circuit layout according to an embodiment of the invention.

FIG. 12 shows another exemplary circuit layout using the set/reset latch 125 of embodiments of FIGS. 8-10. In this embodiment, the reference circuits 140a, 140b and 140c can be moved across chip, near the circuit they are trying to match. In this case the reference circuits are in separate power islands 140a, 140b, 140c which may or may not have power applied at any given time. In embodiments, fencing 150 is needed to switch inactive circuits out of the oscillator feedback loop.

Figure 13:
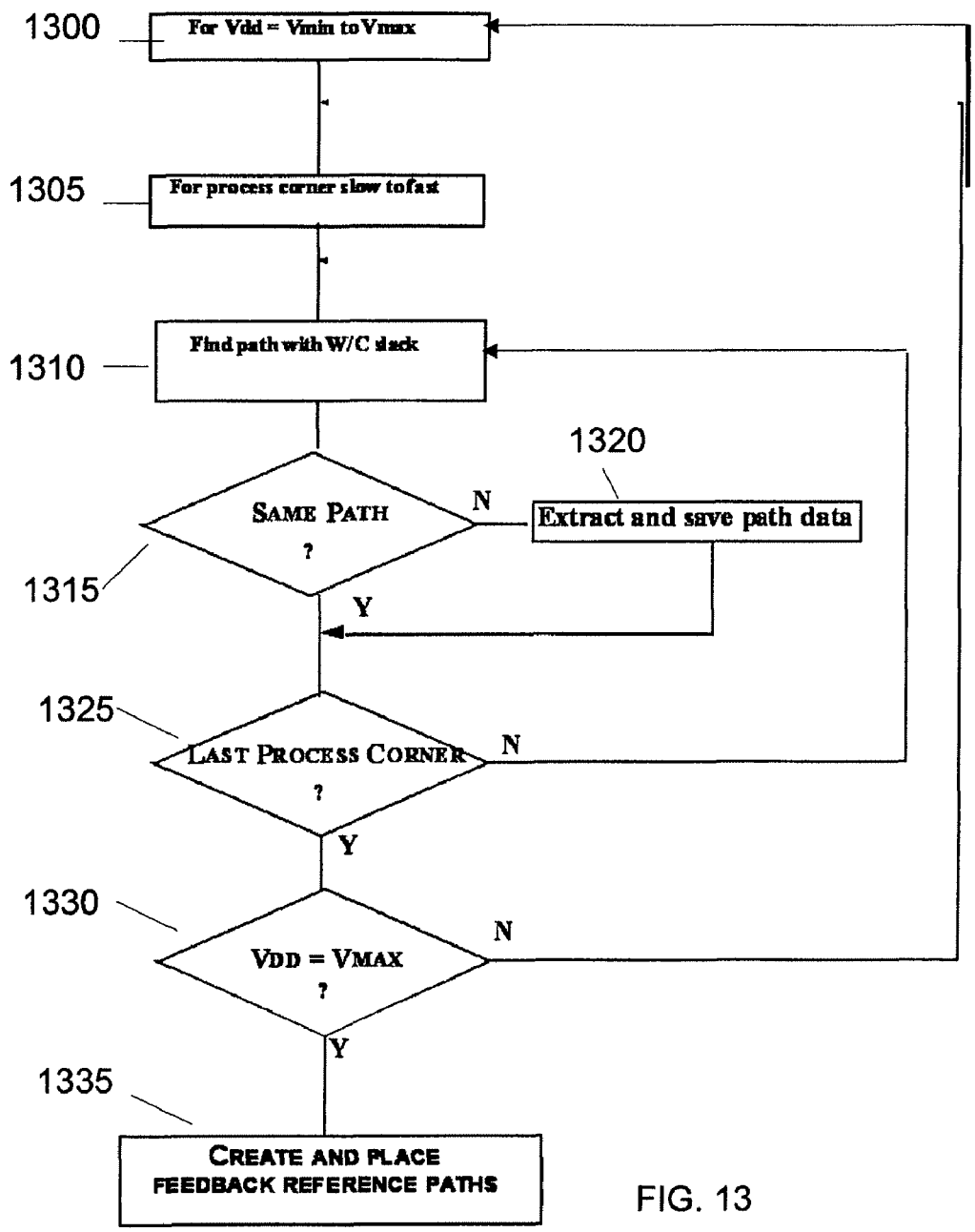
FIG. 13 is a flow diagram implementing steps according to an embodiment of the invention.

FIG. 13 is a flow diagram implementing steps of the invention to determine a worst case path. At step 1300, the process is set for Vdd=Vmin to Vmax. At step 1305, the process is set to find the slow corners for Vmin and the fast corners for Vmax (or any corners of Vx between Vmin to Vmax). At step 1310, a path with worst case slack is found for Vmin to Vmax. At step 1315, a determination is made as to whether the same path has been found, as in a previous implementation of the process. If the same path was not found, then the system extracts and saves the path data at step 1320 and continues to step 1325. If the same path was found at step 1315, at step 1325, a determination is made as to whether the path is associated with the last process corner. If it is not, then the process reverts back to step 1310. If it is the last process corner, at step 1330 a determination is made as to whether $V_{DD}$=Vmax. If $V_{DD}$ is not equal to Vmax, the process returns to step 1300. If $V_{DD}$=Vmax, then the process creates and places the feedback reference paths at step 1335.

As should now be understood, the present invention provides an architecture and method using a VCO or ring oscillator (or similar structures) to produce self-adjusting clocks optimized for process/voltage variations. The architecture and method is configured to manage power using supply voltage as the independent variable while optimizing clock frequency over power/process variations. The architecture and method uses circuits (gates and wiring) in the RO designed to be sensitive to critical process parameters like channel length (or overlap capacitances, etc.). The method includes process steps for selecting critical circuits (paths) for use in dynamic power control/clock optimization. The circuits can be selected to track variations in specific process parameters. Multiple feedback paths may be used, if desired, to ensure that across-chip process variations are accounted for in global clocking (slowest path selected). The paths may be dynamically selected based on transition direction or clock phase. Additionally, feedback paths (oscillator feedback paths) can be trimmed or adjusted, digitally, with fuses, or physically in design. This trimming/adjustment can be done to accentuate specific sensitivities, if the desire is to have the oscillator track particular process parameters. A variety of trimming options can be switched in/out, each making the oscillator sensitive to a specific process parameter.

Figure 14:
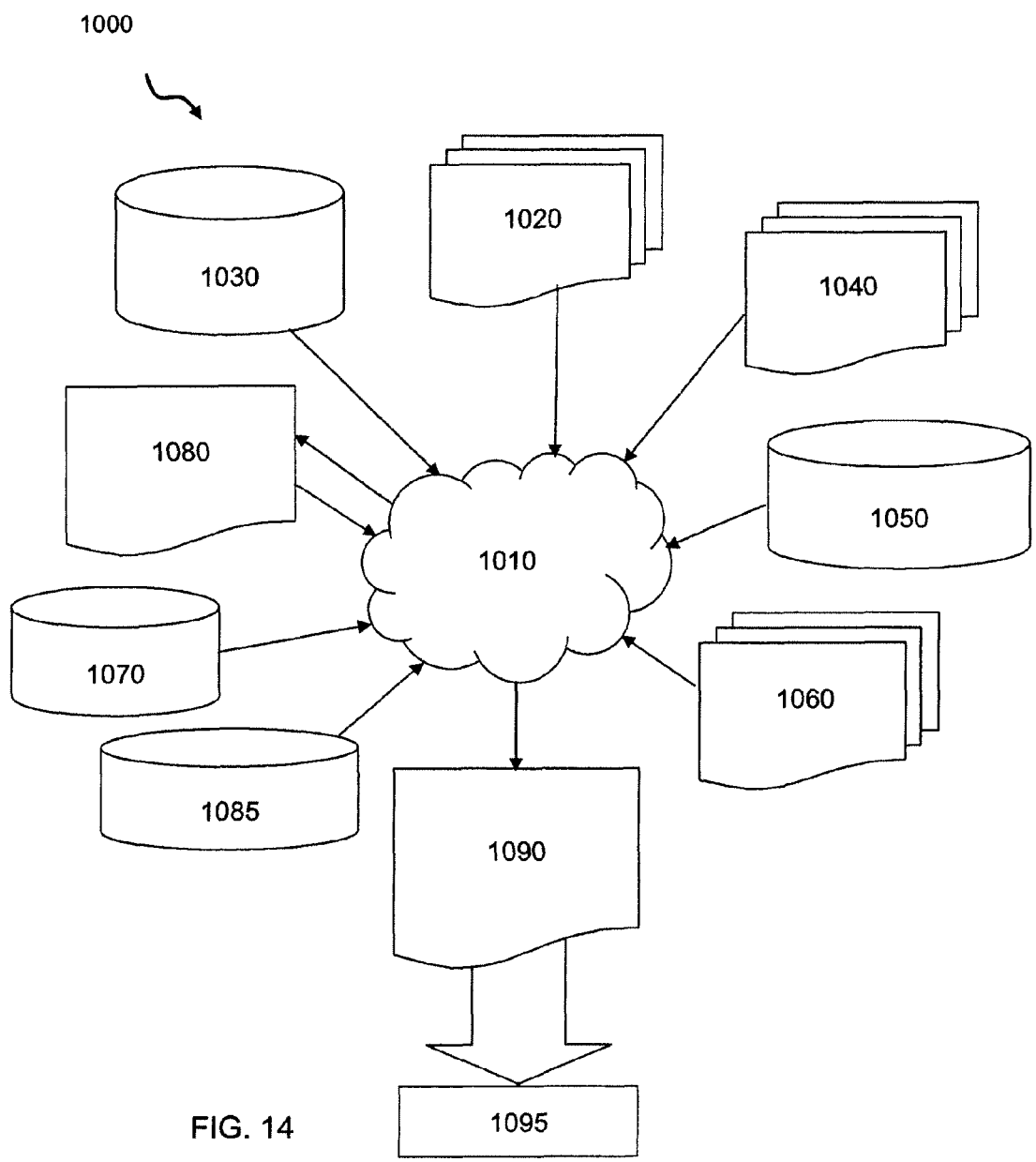
FIG. 14 is a flow diagram of a design process used in semiconductor design, manufacturing, and/or test.

FIG. 14 is a flow diagram of a design process used in semiconductor design, manufacturing, and/or test. FIG. 14 shows a block diagram of an example design flow 1000. Design flow 1000 may vary depending on the type of IC being designed. For example, a design flow 1000 for building an application specific IC (ASIC) may differ from a design flow 1000 for designing a standard component. Design structure 1020 is preferably an input to a design process 1010 and may come from an IP provider, a core developer, or other design company or may be generated by the operator of the design flow, or from other sources. Design structure 1020 comprises the circuits and/or structures of the present invention (See, e.g., FIGS. 4, 5, 7-10 and 12) in the form of schematics or HDL, a hardware-description language (e.g., Verilog, VHDL, C, etc.). Design structure 1020 may be contained on one or more machine readable medium. For example, design structure 1020 may be a text file or a graphical representation of the circuits and/or structures of the present invention. Design process 1010 preferably synthesizes (or translates) the circuits and/or structures of the present invention into a netlist 1080, where netlist 1080 is, for example, a list of wires, transistors, logic gates, control circuits, I/O, models, etc. that describes the connections to other elements and circuits in an integrated circuit design and recorded on at least one of machine readable medium. This may be an iterative process in which netlist 1080 is resynthesized one or more times depending on design specifications and parameters for the circuits.

Design process 1010 may include using a variety of inputs; for example, inputs from library elements 1030 which may house a set of commonly used elements, circuits, and devices, including models, layouts, and symbolic representations, for a given manufacturing technology (e.g., different technology nodes, 32 nm, 45 nm, 90 nm, etc.), design specifications 1040, characterization data 1050, verification data 1060, design rules 1070, and test data files 1085 (which may include test patterns and other testing information). Design process 1010 may further include, for example, standard circuit design processes such as timing analysis, verification, design rule checking, place and route operations, etc. One of ordinary skill in the art of integrated circuit design can appreciate the extent of possible electronic design automation tools and applications used in design process 1010 without deviating from the scope and spirit of the invention. The design structure of the invention is not limited to any specific design flow.

Design process 1010 preferably translates an embodiment of the invention as shown in the accompanying figures, along with any additional integrated circuit design or data (if applicable), into a second design structure 1090. Design structure 1090 resides on a storage medium in a data format used for the exchange of layout data of integrated circuits (e.g. information stored in a GDSII (GDS2), GL1, OASIS, or any other suitable format for storing such design structures). Design structure 1090 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in at least FIGS. 4, 5, 7-10 and 12. Design structure 1090 may then proceed to a stage 1095 where, for example, design structure 1090 proceeds to tape-out, is released to manufacturing, is released to a mask house, is sent to another design house, is sent back to the customer, etc.

While the invention has been described in terms of exemplary embodiments, those skilled in the art will recognize that the invention can be practiced with modifications and in the spirit and scope of the appended claims.

What is claimed:

1. A system for modulating oscillator frequency based on voltage supply variation, comprising:
   a voltage and control oscillator (VCO) source;
   a logic unit having a logic operation frequency; and
   a device to produce self-adjusting clocks to match the logic operation frequency, the device being configured to use supply voltage as an independent variable to optimize device parameters for different voltage variations in the supply voltage, wherein the device drives the logic unit, wherein the VCO source provides the supply voltage to the logic unit and the device; and
   the supply voltage is Vdd.

2. The system of claim 1, wherein the device is one of a voltage and control oscillator (VCO) and a ring oscillator, the device parameters include a clock frequency and the device is configured to use the supply voltage as a control for the clock frequency.

3. The system of claim 2, wherein the VCO has a transfer function matched to the logic operation frequency and the ring oscillator has circuitry matched to the logic operation frequency such that frequency is matched to a speed of the logic unit for a given voltage.

4. The system of claim 2, wherein the VCO or ring oscillator is placed to minimize cross-chip differences.

5. The system of claim 2, wherein the ring oscillator includes at least one feedback path which includes structures configured to be sensitive to critical process parameters.

6. The system of claim 5, further comprising means for trimming the at least one feedback path to accentuate specific sensitivities.

7. The system of claim 5, wherein the at least one feedback path is a path copied from a worst case found in a timing analysis.

8. The system of claim 7, wherein the multiple paths represent different mixes of logic and path lengths which show up in timing analysis.

9. The system of claim 2, further comprising multiple paths which are switched into a feedback loop of the ring oscillator.

10. The system of claim 2, wherein the ring oscillator that is driving system clocks is running off a same supply as the logic unit.

11. The system of claim 2, further comprising:
    multiple paths which are switched into a feedback loop of the ring oscillator; and
    a set/reset latch to automatically select and switch to a slowest path of the multiple paths.

12. The system of claim 11, further comprising an "AND" gate outputting a signal to a "set" function of the set/reset latch and a "NOR" gate outputting a signal to a "reset" function of the set/reset latch, wherein
    switching of paths are eliminated by using the set/reset latch to detect the slowest path,
    rising edges of the paths are provided to the "AND" gate such that the slowest path controls an output of the "AND" gate,
    the output of the set/reset latch goes high when a last path makes a low to high transition,
    on negative transitions, the paths are "0" to satisfy the "OR" gate for the set/reset latch to go low, and
    the AND gate and the OR gate provide information on the slowest path and the set/reset latch discriminates rising edge and falling edges.

13. The system of claim 2, further comprising a frequency doubler located between the ring oscillator and the logic unit.

14. The system of claim 2, further comprising:
    multiple paths which are switched into a feedback loop of the ring oscillator, the multiple paths representing different mixes of logic and path lengths which show up in timing analysis; and
    a set/reset latch to automatically select and switch to a slowest path of the multiple paths.

15. A system for modulating oscillator frequency based on voltage supply variation, comprising:
    a voltage and control oscillator (VCO) source;
    a logic unit having a logic operation frequency; and
    means for optimizing frequency to substantially match the logic operation frequency of the logic unit using only a supply voltage as a control variable, wherein the means for optimizing drives the logic unit,
    wherein the means is a ring oscillator, and further comprising one of:
    (i) multiple paths which are switched into a feedback loop of the ring oscillator, and a set/reset latch to automatically select and switch to a slowest path of the multiple paths;
    (ii) a frequency doubler located between the ring oscillator and the logic unit; and
    (ii) multiple paths which are switched into a feedback loop of the ring oscillator, the multiple paths representing different mixes of logic and path lengths which show up in timing analysis, and a set/reset latch to automatically select and switch to a slowest path of the multiple paths.

16. The system of claim 15, wherein the means is one of a voltage and control oscillator (VCO) and a ring oscillator, the VCO has a transfer function matched to the logic operation and the ring oscillator has circuitry matched to the logic operation such that frequency is matched to a speed of the logic unit for a given voltage using a single variable.

17. The system of claim 16, wherein the ring oscillator includes at least one feedback path which includes structures configured to be sensitive to critical process parameters.

18. The system of claim 16, further comprising multiple paths which are switched into a feedback loop of the ring oscillator, the multiple paths representing different mixes of logic and path lengths which show up in timing analysis.

19. A system for modulating oscillator frequency based on voltage supply variation, comprising:
- a logic unit comprising a system clock having a logic operation frequency;
- a voltage and control oscillator (VCO) driving the logic unit; and
- a supply voltage (Vdd) coupled to the logic unit,
- wherein a frequency is adjusted based on the Vdd such that a decrease in the Vdd results in a decrease in the frequency and an increase in the Vdd results in an increase in the frequency; and
- the supply voltage is provided to the VCO.

20. The system of claim 19, wherein a VCO source provides the supply voltage (Vdd) to both the logic unit and the voltage and control oscillator (VCO) driving the logic unit.

21. A design process, comprising:
translating a hardware description language (HDL) design structure encoded on a tangible machine-readable data storage medium to a second design structure, said HDL design structure comprising elements that when processed in a computer-aided design system generates a machine-executable representation of a system for modulating oscillator frequency based on voltage supply variation, wherein said HDL design structure comprises:
- a voltage and control oscillator (VCO) source;
- a logic unit having a logic operation frequency; and
- a device to produce self-adjusting clocks to match the logic operation frequency, the device being configured to use supply voltage as an independent variable to optimize device parameters for different voltage variations in the supply voltage, wherein the device drives the logic unit, the VCO source provides the supply voltage to the logic unit and the device, and the supply voltage is Vdd, and
wherein the second design structure resides on a storage medium in a data format used for the exchange of layout data of integrated circuits, and
the design process is performed using at least one of electronic design automation tools and applications.

22. The design process of claim 21, wherein the device is a ring oscillator, and wherein said HDL design structure further comprises one of:
(i) multiple paths which are switched into a feedback loop of the ring oscillator, and a set/reset latch to automatically select and switch to a slowest path of the multiple paths; p1 (ii) a frequency doubler located between the ring oscillator and the logic unit; and
(ii) multiple paths which are switched into a feedback loop of the ring oscillator, the multiple paths representing different mixes of logic and path lengths which show up in timing analysis, and a set/reset latch to automatically select and switch to a slowest path of the multiple paths.

23. The design process of claim 21, further comprising synthesizing or translating circuits and/or structures of the HDL design structure into a netlist, wherein the netlist is a list of at least one of wires, transistors, logic gates, control circuits, I/O, and models that describes connections to other elements and circuits in an integrated circuit design and recorded on at least one of machine readable medium.

* * * * *